United States Patent
Moss

(10) Patent No.: US 7,869,210 B2
(45) Date of Patent: Jan. 11, 2011

(54) TEMPERATURE CONTROL FOR AN INFORMATION HANDLING SYSTEM RACK

(75) Inventor: David L. Moss, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 112 days.

(21) Appl. No.: 12/247,513

(22) Filed: Oct. 8, 2008

(65) Prior Publication Data

US 2010/0085707 A1 Apr. 8, 2010

(51) Int. Cl.
*H05K 7/20* (2006.01)

(52) U.S. Cl. .................... 361/694; 361/695; 454/184

(58) Field of Classification Search .................. None
See application file for complete search history.

(56) References Cited

U.S. PATENT DOCUMENTS

| | | | | |
|---|---|---|---|---|
| 3,359,728 | A | 12/1967 | Torossian | 60/54.5 |
| 5,080,282 | A | 1/1992 | Harmon | 236/13 |
| 6,574,970 | B2* | 6/2003 | Spinazzola et al. | 62/89 |
| 6,776,707 | B2* | 8/2004 | Koplin | 454/184 |
| 6,819,563 | B1* | 11/2004 | Chu et al. | 361/696 |
| 7,011,576 | B2* | 3/2006 | Sharp et al. | 454/184 |
| 7,643,291 | B2* | 1/2010 | Mallia et al. | 361/695 |
| 2002/0055329 | A1* | 5/2002 | Storck et al. | 454/186 |
| 2004/0075984 | A1* | 4/2004 | Bash et al. | 361/695 |
| 2005/0011208 | A1 | 1/2005 | Dobbs et al. | 62/178 |
| 2005/0237716 | A1 | 10/2005 | Chu et al. | 361/696 |
| 2006/0080001 | A1 | 4/2006 | Bash et al. | 700/276 |
| 2006/0091229 | A1 | 5/2006 | Bash et al. | 236/49.3 |
| 2007/0019380 | A1 | 1/2007 | Campbell et al. | 361/687 |
| 2007/0213000 | A1* | 9/2007 | Day | 454/184 |
| 2009/0056910 | A1* | 3/2009 | Mallia et al. | 165/80.3 |
| 2009/0086428 | A1* | 4/2009 | Campbell et al. | 361/694 |
| 2010/0067193 | A1* | 3/2010 | Arimilli et al. | 361/679.47 |

* cited by examiner

*Primary Examiner*—Gregory D Thompson
(74) *Attorney, Agent, or Firm*—Baker Botts L.L.P.

(57) ABSTRACT

A system for controlling the temperature of a rack includes a connecting plenum configured to receive incoming cooling air from outside a rack for cooling the rack; a front plenum connected to the connecting plenum and configured to receive cooling air from the connecting plenum and deliver the cooling air to the rack, the cooling air being warmed by powered electrical components as it passes through the rack; at least one ventilator for recycling warmed cooling air from the rack back to the connecting plenum to be mixed with incoming cooling air; a sensor for sensing temperature of air in the rack; and a controller for controlling the at least one ventilator based at least on the sensed temperature.

20 Claims, 4 Drawing Sheets

TEMPERATURE CONTROL FOR AN INFORMATION HANDLING SYSTEM RACK

TECHNICAL FIELD

The present disclosure relates in general to information handling systems, and more particularly to systems and methods for controlling the temperature in an information handling system rack (e.g., a server rack).

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

A group of one or more information handling systems may form an information handling center. An information handling center can occupy one room of a building, one floor, or an entire building, for example. An information handling center may include, for example, a number of servers racked up into 19 inch rack cabinets, often placed in single rows forming corridors between them, which allows human access to the front and rear of each cabinet. Servers differ greatly in size from 1 U servers to very large storage silos. Some equipment such as mainframe computers and storage devices are often as big as the racks themselves.

A 19-inch rack is a standardized system for mounting various electronic modules in a "stack," or rack that is 19 inches (482.6 mm) wide. Equipment designed to be placed in a rack is typically described as rack-mount, a rack mounted system, a rack mount chassis, subrack, rack mountable, or simply shelf. This standard rack arrangement is widely used throughout the telecommunication, computing, audio, entertainment and other industries.

The physical environment of an information handling center is typically under strict control, especially the temperature within the information handling center. Air conditioning is typically used to control the temperature and humidity in the information handling center. For example, a temperature range of 20-25° C. and humidity range of 40-60% is typically suitable for information handling center conditions. The electrical power used by the electronic equipment is converted to heat, which is transferred to the ambient air in the space near the electronic equipment. Unless the heat is removed, the ambient temperature will rise, which may result in electronic equipment malfunction. By controlling the air temperature of the space, the electronic components may be kept within the manufacturer's specified temperature/humidity range. Air conditioning systems may help control space humidity within acceptable parameters by cooling the return space air below the dew point. A raised floor may be used in order to distribute cooled air within an information handling center.

Information handling centers are typically equipped with a raised floor with vent tiles configured to provide cool air to the information handling systems (e.g., racks) from a pressurized plenum in the space below the raised floor. One system for cooling racks has been suggested before in US Patent Publication No. 2005/0237716 A1, "Air Flow System and Method for Facilitating Cooling of Stacked Electronics Components" where an airflow plenum is added to either and/or the front and rear of a rack. In the case where the plenum is added to the front of the rack, it picks up air from a tile supplying cool air immediately in front of the rack.

These vent tiles are typically unable to vary the airflow dynamically to the information handling center. In addition, the vent tiles typically operate without knowledge of how each vent tile affects information handling systems in its proximity. This may have unintended consequences, e.g., inadequate airflow delivery to the racks and/or wasted energy consumption, which may lead to inefficiencies in both cooling of the information handling systems as well as in the operations of air conditioning units.

It is desirable to distribute air having a controlled temperature to information handling systems, such as for example racks. This may avoid too high or too low ambient air temperatures of a rack. Reducing or minimizing chilled air consumption is beneficial, e.g., to lower operating costs of an information handling center. In addition, reducing the total flow of air in a raised floor and/or air conditioned room may lower running costs.

Reduced airflow consumption in rack products, especially servers, is typically desirable, as facility electricity devoted to cooling can be substantial. In a typical chilled water facility, for example, where large air handling units (AHU) pressurize a raised floor, energy is used by the AHU to transport chilled air to the server and heated air back from the server. Energy is also used remotely at the chiller plant to chill water for use around the facility, at the outside condenser for ultimate heat rejection, and for transporting fluid (generally water) to and from the chiller and condenser. As the AHU uses energy to move air, it also adds heat to the facility which must also be removed through the chiller and condenser. The open raised floor environment is often accompanied by a large over-provisioning of AHU's due to poor and unpredictable airflow dynamics that create hot spots. Many data centers end up over-provisioning to cool these hot spots and/or spend much more energy than needed in chilling the air to temperatures lower than necessary.

SUMMARY

In accordance with the teachings of the present disclosure, certain disadvantages and problems associated with cooling of rack-mounted electronic units have been substantially reduced or eliminated.

According to certain embodiments of the present disclosure, a system for controlling the temperature of a rack includes a connecting plenum configured to receive incoming cooling air from outside a rack for cooling the rack; a front plenum connected to the connecting plenum and configured to receive cooling air from the connecting plenum and deliver the cooling air to the rack, the cooling air being warmed by powered electrical components as it passes through the rack; at least one ventilator for recycling warmed cooling air from the rack back to the connecting plenum to be mixed with incoming cooling air; a sensor for sensing temperature of air in the rack; and a controller for controlling the at least one ventilator based at least on the sensed temperature.

According to certain other embodiments of the present disclosure, a system includes a rack, a plurality of information handling systems disposed in the rack, and a temperature control system for controlling the temperature of the rack. The temperature control system includes a connecting plenum configured to receive incoming cooling air from outside a rack for cooling the rack; a front plenum connected to the connecting plenum and configured to receive cooling air from the connecting plenum and deliver the cooling air to the rack, the cooling air being warmed by powered electrical components as it passes through the rack; a back plenum configured to received warmed cooling air from the rack; at least one controllable ventilator for recycling warmed cooling air from the back plenum to the connecting plenum to be mixed with incoming cooling air; at least one temperature sensor for sensing air temperature in the system; and a controller for controlling the at least one ventilator based at least on the sensed air temperature.

According to certain other embodiments of the present disclosure, a method for controlling a cooling system configured to control the temperature of an information handling system rack is provided. The method includes setting a target temperature or a target temperature band for an information handling system rack and operating a cooling system. The cooling system is operated such that cooling air is received from outside the cooling system into a connection plenum, flows from the connection plenum to a delivery plenum, and flows from the delivery plenum through the information handling system rack, the cooling air being warmed by electrical components as the cooling air flows through the information handling system rack. The method further includes taking one or more air temperature measurements, and based on the one or more air temperature measurements, controlling one or more ventilators to control an amount of warmed cooling air from the information handling system rack to recycle back into the connection plenum to mix with incoming cooling air.

In at least one embodiment, consumption of cooling air may be reduced or minimized. Such an embodiment may, for example, lower running costs of data centers and/or reduce energy consumption.

In at least one embodiment, total flow of cooling air for a rack may be reduced. This may in turn lower running costs and/or reduce energy consumption.

In at least one embodiment, effective cooling with a low cost and with relatively low construction costs may be achieved. Such an embodiment may enable financial savings. In at least one embodiment, specific volumetric quantities of air may be distributed to a rack, which may in turn lower running costs and/or reduce energy consumption.

BRIEF DESCRIPTION OF THE DRAWINGS

A more complete understanding of the present embodiments and advantages thereof may be acquired by referring, by way of example, to the following description taken in conjunction with the accompanying drawings, in which like reference numbers indicate like features, and wherein.

DETAILED DESCRIPTION

Preferred embodiments and their advantages are best understood by reference to FIGS. 1 to 4, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network storage device, or any other suitable device and may vary in size, shape, performance, functionality, and price. The information handling system may include memory, one or more processing resources such as a central processing unit (CPU) or hardware or software control logic. Additional components or the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

Figure 1:
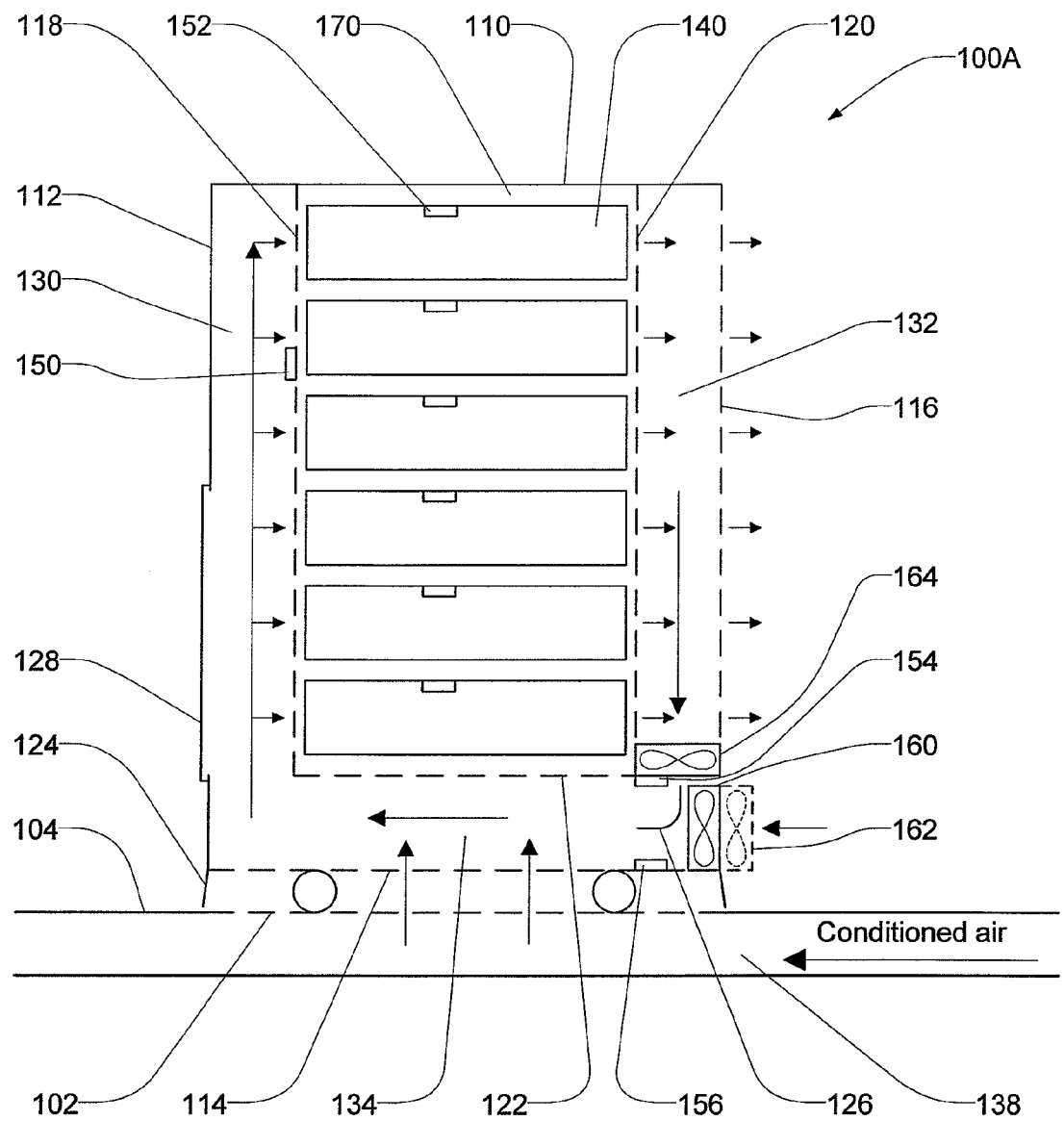
FIGS. 1 and 2 illustrate two example embodiments of a system for cooling an information handling system rack (e.g., a server rack), according to certain embodiments of the present disclosure.
Figure 2:
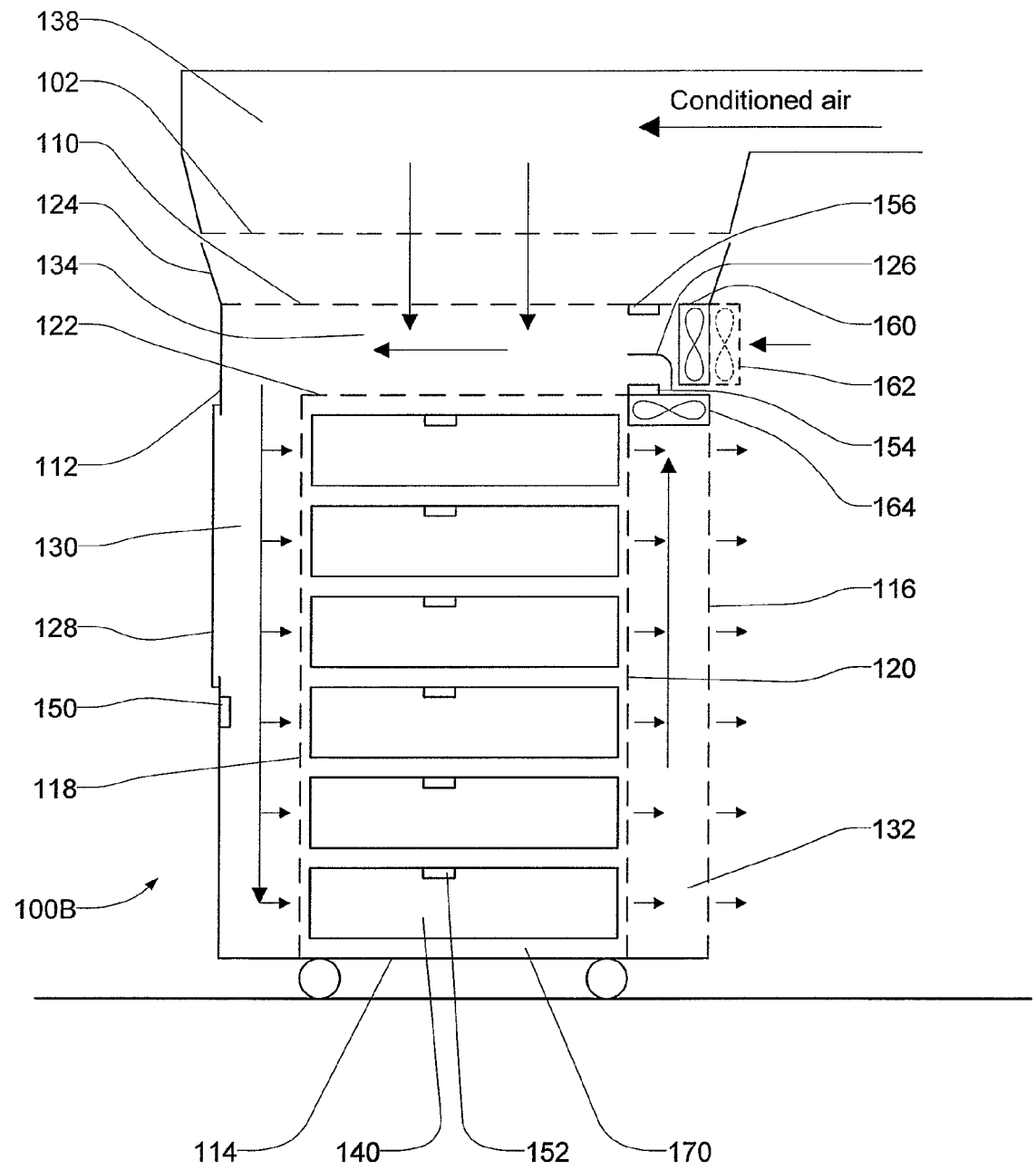

FIGS. 1 and 2 illustrate two example embodiments of a system for cooling an information handling system rack (e.g., a server rack), according to certain embodiments of the present disclosure. The example embodiments in FIGS. 1 and 2 generally resemble each other and have similar technical features. The main difference is that cooling air is supplied from below in the embodiment illustrated by FIG. 1, while cooling air is supplied from above in the embodiment illustrated by FIG. 2. Like reference numbers are used to indicate like and corresponding parts in FIGS. 1 and 2.

FIG. 1 illustrates an example embodiment of a system 100A, for example an information handling system in the form of a rack 170 (e.g., a server rack). A data center may for example include one or more such systems 100A. The system 100A may include a top side 110, a front side 112, a bottom side 114, and a rear side 116. Further, the system may include a front rack side 118, a back rack side 120, and a connecting rack side 122.

The front rack side 118, the back rack side 120, the top side 110, and the connecting rack side 122 may be connected to each other and form a rack 170 for one or more rack units 140. The top side 110, the front side 112, the bottom side 114, and the rear side 116 may be connected to each other and form the outer sides of the system 100A.

A front plenum 130 may be formed between the front side 112 and the front rack side 118. The front plenum 130 may be configured to transport air throughout the entire height of the rack 170. A back plenum 132 may be formed between the rear side 116 and the back rack side 120. The back plenum 132 may be configured to transport air throughout the entire height of the rack 170. A connecting plenum 134 may be formed between the connecting rack side 122 and the bottom side 114. The connecting plenum 134 may connect the front plenum 130 and the back plenum 132, for example at 90 degree connections, and may be configured to transport air from the back plenum 132 to the front plenum 130. In the specific example illustrated by FIG. 1, the connecting plenum 134 is located at the bottom of the system 100A.

FIG. 1 illustrates six rack units 140 within the rack 170 as an example, but any suitable numbers of rack units may be placed in the rack 170. The rack units 140 may or may not include sensors 152, e.g., temperature sensors. One or more sensors may be placed within a rack unit 140, such as for example a temperature sensor 152 included in the rack unit 140 for sensing the temperature of components within the rack unit 140. A sensor dedicated to the rack unit 140 may indicate air temperature of the air flow through the rack 170.

The front rack side 118, the back rack side 120, and the connecting rack side 122 may allow air to pass through them, for example by including one or more openings allowing air flow, e.g., as shown in FIG. 1. Similarly, the bottom side 114 and the rear side 116 may allow air to pass through them, for example by including one or more openings allowing air flow, e.g., as shown in FIG. 1. Thus, cool air for cooling the rack 170 may enter through the bottom side 114 into the connecting plenum 134. From the connecting plenum 134 the air may move to the front plenum 130 and continue into the rack 170, as indicated by arrows in FIG. 1. From the connecting plenum 134 the air may also move directly into the rack 170 via openings in the connecting rack side 122, as indicated by arrows in FIG. 1. The cooling air cools the rack 170 and its rack units 140. The air flowing through rack 170 may be heated by warm rack units 140 and the heated air may move into the back plenum 132 and out from the rack 170 through openings in rear side 116 into the space surrounding the system 100A, as indicated by arrows in FIG. 1.

One or more ventilators 160, 162, 164 may be used for moving air to the connecting plenum 134. In one embodiment, a ventilator 160 may be located on the inside of the system 100A, for example inside the connecting plenum 134. The ventilator 160 may move air from outside the system 100A in to the connecting plenum 134. Alternatively, or additionally, a ventilator 162 may be located on the outside of the system 100A for moving air from outside the system 100A in to the connecting plenum 134. Alternatively, or additionally, a ventilator 164 may be located in the air flow between the back plenum 132 and the connecting plenum 134 for moving air from the back plenum 132 into the connecting plenum 134. In this manner, warmer air may be moved into the connecting plenum 134 and mixed with the cooling air for the rack 170. This may reduce the amount of cool air used for cooling the rack 170.

The one or more ventilators 160, 162, 164 may include, e.g., powered fans, actuated vents, a combination of both, or any other device for generating or promoting an air flow. In the case of a powered fan, the level of air flow generated by the fan may be controlled by controlling the rotational speed of the fan. Tables may indicate the amount of air moved by a fan at a specific rotational speed. In the case of an actuated vent, the air flow may be regulated by incrementally opening and closing the vent by an actuator. To ensure that the air flows in the right direction, the vents may be configured to only allow air to pass through in one direction, for example from the back plenum 132 to the connecting plenum 134.

Sensors 150, 152, 154, 156 may be provided for sensing the temperature of the air within the system 100A. These sensors may be one or more discrete rack sensors 150, 154, 156, or one or more sensors 152 of a rack unit 140 disposed in the rack 170, or a combination of both. The sensors may indicate the temperature of the air flow within different parts of the system 100A.

The temperature of the air flowing into the rack 170, namely the temperature of the air flow in the front plenum 130, may represent important control data. Thus, at least one sensor 150 may be placed within the front plenum 130. The location of the sensor 150 illustrated in FIG. 1 is only an example and any suitable location within the front plenum 130 may be used.

The temperature of the cool air that flows into the connecting plenum 134 may also represent important control data. Thus, at least one sensor 156 may be placed within the connecting plenum 134. The location of the sensor 156 illustrated in FIG. 1 is only an example and any suitable location within the connecting plenum 134 may be used.

The temperature of the air that flows out of the rack 170 or within the back plenum 132 may also represent important control data because this air flow is mixed with the cooling air flow in the connecting plenum 134. Thus, the temperatures of the two air flows mixing in the connecting plenum may be determined. Thus, at least one sensor 154 may be placed within the connecting plenum 134 or the back plenum 132. The location of the sensor 154 illustrated in FIG. 1 is only an example and any suitable location within the connecting plenum 134 or back plenum 132 may be used.

The system 100A may further include guide element 126, for example a turning vane or other structure, for guiding air from the back plenum 132 into the connecting plenum 134. The guide element 126 may be configured to separate, in the vicinity of at least one of the sensors 154, 156, warmer air from the back plenum 132 from cooler air entering the connecting plenum 134 from outside the rack 170. In this way the temperature sensor 154 may accurately measure the temperature of the air flow moved by the ventilator 164, and the temperature sensor 156 may accurately measure the temperature of the incoming cooling air, without cross-interference between the two air flows. In other words, the warmer air measurement is separated from the cool air measurement. The example guide element 126 in FIG. 1 is L-shaped. However, this is only one example; any suitable shape (e.g., planar, curved, etc.) and/or orientation of a guide element for guiding the air flow in the connecting plenum 134 may be used.

The system 100A may be placed in any suitable space, such as for example a computer center, room, or similar. The space may be equipped with a raised floor 104 with vent tiles 102 configured to provide cool air to information handling systems, such as racks 170, from a floor 138 in the space below the raised floor 104.

In embodiments in which the connecting plenum 134 is a lower plenum (e.g., the embodiment of FIG. 1), the system 100A may be connectable to a floor plenum 138 with cool air by means of a skirt 124. The skirt 124 may include rubber, brushes, or any other suitable material for guiding the cool air from the floor plenum 138 to the lower plenum 134. Preferably, the skirt 124 may be of a compliant material for rack transport.

In one embodiment, the front side 112 may be, or may include, a front door. The front door 112 may be solid and include a front access panel 128 configured to allow at least partial access to the rack 170. The access panel 128 may for example be a sliding or hinged door that substantially preserves the integrity of the front plenum 130 when the front door 112 is closed, to reduce or minimize any disturbances to the internal air flow of the system 100A, which may reduce the necessary amount of cool air for cooling the rack.

FIG. 2 illustrates another example system 100B, in accordance with certain embodiments of the present disclosure. System 100B resembles system 100A of FIG. 1, except in system 100A the cool air for cooling the rack is supplied from the floor, while in system 100B the cool air is supplied from above, e.g., from the ceiling. Like reference numbers are used to indicate like and corresponding parts between the example embodiments shown in FIGS. 1 and 2.

The front rack side 118, the back rack side 120, and the connecting rack side 122 may allow air to pass through, e.g., by including one or more openings. The top side 110 and the rear side 116 may also allow air to pass through, e.g., by including one or more openings. Thus, cool air for cooling the rack 170 may enter through the top side 110 into the connecting plenum 134, as indicated by arrows in FIG. 2. From the connecting plenum 134 the air may move to the front plenum 130 and continue into the rack 170, as indicated by arrows in FIG. 2. From the connecting plenum 134 the air may also move directly into the rack 170 via the connecting rack side 122, as indicated by an arrow in FIG. 2. The cooling air cools the rack 170 and its units 140. The air passing through rack 170 may be heated by warm rack units 140 and the heated air may move into the back plenum 132 and out from the rack 170 through openings in rear side 116, as indicated by arrows in FIG. 2.

The space in which the system 100B may be placed may be equipped with an overhead cool air supply system. Such a system may include, e.g., a ceiling plenum with vent 102 configured to provide cool air to information handling systems, such as racks 170.

In embodiments in which the connecting plenum 134 is an upper plenum, e.g., as illustrated in FIG. 2, the system 100B may be connectable to a ceiling plenum 138 providing cool air. Depending on the existing ceiling plenum, this connection may be facilitated by means of a skirt 124. The skirt 124 may include rubber, brushes, or any other suitable material for guiding the cool air from the ceiling plenum 138 to the upper plenum 134.

Further, the shape and/or orientation of the guide element 126 in FIG. 2 for guiding air from the back plenum 132 into the connecting plenum 134 may differ from the shape and/or orientation of the guide element 126 in FIG. 1. For example, the guide element 126 shown in FIG. 2 is L-shaped, but arranged in a different orientation than the guide element 126 in the embodiment of FIG. 1. However, this is only one example; any suitable shape (e.g., planar, curved, etc.) and/or orientation a guide element for guiding the air flow in the connecting plenum 134 may be used.

The guide element 126 may be configured to separate, in the vicinity of at least one of the sensors 154, 156, warmer air from the back plenum 132 from cooler air entering the connecting plenum 134 from outside the rack 170. In this way the temperature sensor 154 may accurately measure the temperature of the air flow moved by the ventilator 164, and the temperature sensor 156 may accurately measure the temperature of the incoming cooling air, without cross-interference between the two air flow. In other words, the warmer air measurement is separated from the cool air measurement.

According to other embodiments, the space in which system 100A and/or 100B is placed may be an air-conditioned room. In such embodiments, cool air may not be supplied from specific plenums from above or below; instead, cool air surrounds the system 100 and may for example enter the system 100 through the aid of ventilators 160 or 162. Cool air may enter the connecting plenum 134 and, depending on the sensed temperature, the heated air by the rack 170 may be mixed with the cool air.

Figure 3:
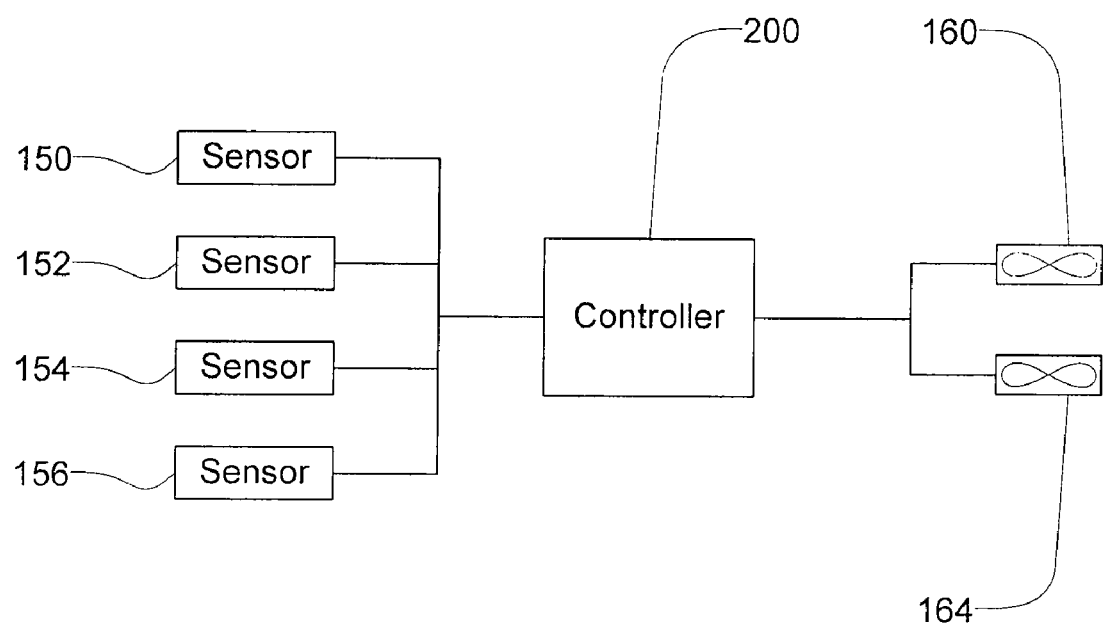
FIG. 3 illustrates an example configuration for controlling ventilators of the cooling system of FIG. 1 or 2, according to certain embodiments of the present disclosure.

FIG. 3 illustrates an example configuration for controlling ventilators according to certain embodiments of the present disclosure, which may, for example, be used in connection with any of the embodiments shown in FIG. 1 or 2. At least one of the sensors 150, 152, 154, 156 may be connected to a controller 200, which in may be is connected to at least one ventilator 160, 164. As disclosed above, the rack 170 may include one or more sensors 152 within each rack unit 140.

The temperature readings of the sensors 150, 152, 154, 156 may be processed by the controller 200 to control the at least one ventilator 160, 162, 164. For example, in the case of a fan, the controller 200 may increase, decrease or stop the fan based on the temperature readings. As another example, in the case of an actuated vent, the controller 200 may open or close the vent fully or partially.

According to some embodiments, a front plenum extension is added to an otherwise standard rack. The front plenum is configured to a depth capable of transporting air throughout the entire height of the rack. The extended front door may be solid such that air delivered to the rack travels vertically, parallel to the front door. Vent tiles may be placed below the rack such that the entire underside of the rack accepts cooling air from a raised floor plenum. A connecting rack plenum may be formed, likely to decrease the useable rack space. The connecting plenum may deliver air to the front plenum.

The connecting plenum (lower plenum) may be fairly tightly coupled to the raised floor by an extension, a skirt, of the rack extending to the floor (in the area of the casters). This skirt may include a compliant material for transport. Material examples may include brush or rubber where the material is reasonably impervious to air but compliant enough for rack transport.

At least one mixing ventilator, such as for example a fan, may be added to the rear of the rack. In operation, the effect of the mixing ventilator is to inject warm IT exhaust into the connecting plenum. Mixed with the cool air from the raised floor, this controlled injection of warm air enables a targeted delivery temperature for the front plenum. A control mechanism adjusts the ventilators based on an inlet temperature sensor or average of several sensors. The sensors may be discrete rack sensors or sensors built into a specified server(s).

Figure 4:
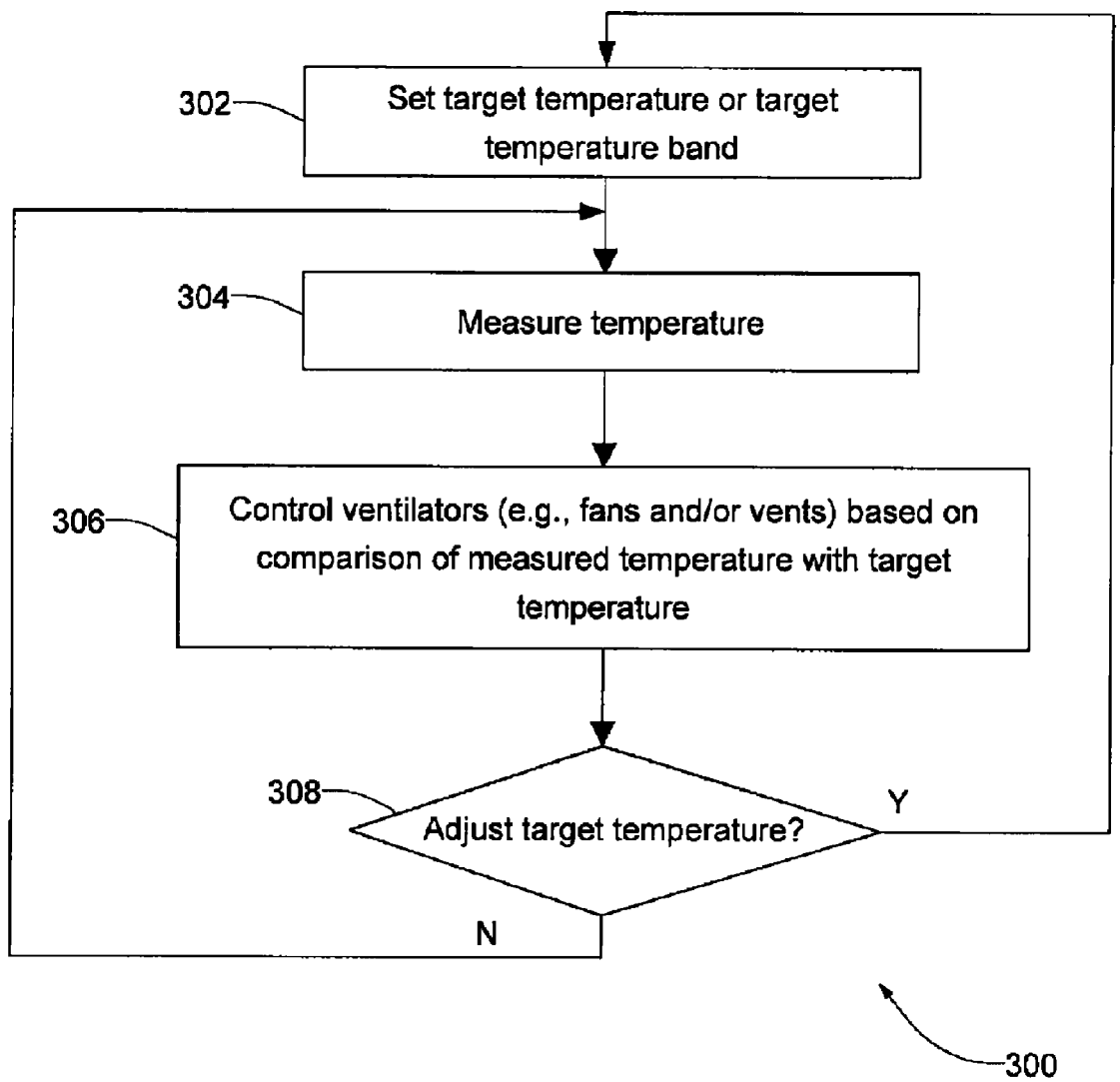
FIG. 4 illustrates a flow chart of an example method for controlling the temperature of an information handling system rack, in accordance with an embodiment of the present disclosure.

FIG. 4 illustrates a flow chart of an example method 300 for controlling the temperature of a rack, in accordance with the present disclosure. The method may implemented, for example, by systems 100A and/or 100B described above.

At step 302, system 100A and/or 100B (generally referred to as system 100) may initiate control of the temperature in the rack 170. A target temperature or a target temperature band is set, for example as a default value or by a user of the system. The target temperature set may for example be 25 degrees Celsius or any other temperature suitable for assuring proper working of the electronic components in the rack 170. The target temperature band may for example be 24 to 26 degrees Celsius or any other temperature band suitable for assuring proper working of the electronic components in the rack 170. A default value of 25 degrees Celsius may be used.

At step 304, one or more sensors 150, 152, 154, 156 may take one or more temperature measurements and communicate such temperature measurements to controller 200.

At step 306, controller 200 may compare the sensed temperatures from sensors 152 with the target temperature or the target temperature band, and in response, control ventilators 160, 162, 164 accordingly. For example, controller 200 may control ventilators 160, 162, 164 in order to control (a) the amount of cool air delivered to the system 100 and/or (b) the mixture of warmer air (e.g., air flow that has passed through the rack and/or air flow from outside the rack) with cooling air in the connecting plenum 134.

If the temperature sensors 150, 152, 154, 156 register a temperature greater than the target temperature or target temperature band, controller 200 may control ventilators 160, 162, 164 to increase cooling in the rack 170. For example, controller 200 may control one or more ventilators that provide cool air to the system 100 to increase the amount of cool air delivered into the system, e.g., by turning on or speeding up one or more cool air fans (e.g., ventilator 160 shown in FIG. 1). In addition or alternatively, controller 200 may control one or more ventilators 160, 162, 164 in order to decrease or completely shut off the amount of warmer air (e.g., air flow that has passed through the rack and/or air flow from outside the rack) that enters into the connecting plenum 134 to mix with the cooler air. As one example, controller 200 may turn off or reduce the speed of one or more fans that recycle warmer air into the connecting plenum 134 (e.g., ventilator 164 shown in FIG. 1). As another example, controller 200 may fully or partially close one or more actuated vents that allows warmer air (e.g., air flow that has passed through the rack and/or air flow from outside the rack) to mix with the cooling air in connecting plenum 134.

Alternatively, if the temperature sensors 150, 152, 154, 156 register a temperature lower than the target temperature or target temperature band, controller 200 may control ventilators 160, 162, 164 to decrease cooling in the rack 170. For example, controller 200 may control one or more ventilators that provide cool air to the system 100 to decrease the amount of cool air delivered into the system, e.g., by turning off or slowing down one or more cool air fans (e.g., ventilator 160 shown in FIG. 1). In addition or alternatively, controller 200 may control one or more ventilators 160, 162, 164 in order to increase the amount of warmer air (e.g., air flow that has passed through the rack and/or air flow from outside the rack) that enters into the connecting plenum 134 to mix with the cooler air. As one example, controller 200 may turn on or increase the speed of one or more fans that recycle warmer air into the connecting plenum 134 (e.g., ventilator 164 shown in FIG. 1). As another example, controller 200 may fully or partially open one or more actuated vents that allows warmer air (e.g., air flow that has passed through the rack and/or air flow from outside the rack) to mix with the cooling air in connecting plenum 134.

In some embodiments, controller 200 may use an averaged temperature measurement from one or more sensors 150, 152, 154, 156. The sensed temperature used in the method may be an average temperature of several sensors. An average of the temperature may also be established with a plurality of measurements (from one or multiple sensors) averaged over time. The average temperature may be fully or partly derived from sensors 152 of rack units within the rack, or from discrete rack sensors 150, 154, 156, or a combination of both.

At step 308, a new target temperature or target temperature band may or may not be set (e.g., by controller 200 or by a user). The method may then return to step 304.

Controller 200 may continue to analyze the temperature measurements and adjust the ventilators 160, 162, 164 to meet and maintain the prescribed temperature or temperature band. In other words, steps 304-308 may be repeated as long as desired.

The method for controlling the temperature within the rack 170 may be used to estimate flow rates within the system 100. Flow rates may be estimated within the system 100 by assuming that the cooling air flow into the connecting plenum 134 is the same as the air flow leaving the system. Such estimation is further described below.

The method for controlling the temperature within the rack 170 may also be used to estimate savings made by using less cool air than a similar rack without the disclosed system 100 or compared with other systems. Saved cool air consumption may be estimated as the air moved by the at least one ventilator 160, 162, 164. Thus, a value can be established that quantifies one benefit of the disclosed system 100.

Turning to the estimations of air flow that can be made in certain embodiments of the present disclosure, the following further disclosure is made for a better understanding of such estimations. The following variables may be assumed:

Ti=Temperature of air in the front plenum 130;
Tf=Temperature of cool air to the connecting plenum 134;
Tm=Temperature of warm air to the connecting plenum 134 to be mixed with the cooling air;
Fi=Air flow in the front plenum 130;
Fm=Air flow through the at least one ventilator 160, 162, 164;
Fr=Air flow through the rack 170;
A %=percentage of cool air flow to the connecting plenum 134; and
B %=percentage of warm air flow to the connecting plenum 134.

Air flow through one or more fans (e.g., 160, 162, 164) may be derived from tables indicating the air flow (Fm) based on the rotational speed of the fan(s). Assume further that the cooling air flow into the connecting plenum 134 is the same as the air flow leaving the system 100 and that saved air consumption is the same as the air moved by the one or more fans. Further, the following may be assumed for the system 100:

$$Tf*A\%+Tm*B\%=Ti$$

$$A\%+B\%=100\%$$

Fi and Fr may then be calculated:

$$Tf*(100\%-B\%)+Tm*B\%=Ti$$

$$B\%=(Ti-Tf)/(Tm-Tf)$$

$$B\%=Fm/Fi$$

$$Fi=Fm \text{ (looked up in table)}/B\%$$

$$Fr=Fi-Fm$$

With the disclosed systems and methods, Fi and Fr may be calculated or estimated. The amount of air consumption (Fm) saved for the rack using the systems and method disclosed herein can consequently be looked up based on the rotational speed of the fan(s) (rotations per minute, RPM). The amount of air consumed by the rack may be estimated as Fi.

In operation for a specific embodiment, the approximate flow expressed in percent (based on the total flow rate of the rack in the specific embodiment) required to achieve a mixed temperature of 75 Fahrenheit in a rack full of information handling systems based on the cooling air temperature (Tf) delivered to the connecting plenum and the temperature rise in the rack (dT), may be illustrated by the following table. Values of dT are listed in bold in the top row, values of Tf are listed in bold in the first column, and values of the percent of cooling air required to achieve a mixed temperature of 75 Fahrenheit in a rack full of information handling systems based on the cooling air temperature (Tf) delivered to the connecting plenum and the temperature rise in the rack (dT) are listed in the corresponding boxes.

|  | 20 dT | 25 dT | 30 dT | 35 dT | 40 dT |
|---|---|---|---|---|---|
| 55 Tf | 50% | 56% | 60% | 64% | 66% |
| 57 Tf | 53% | 58% | 63% | 66% | 69% |
| 59 Tf | 56% | 61% | 65% | 69% | 71% |
| 61 Tf | 59% | 64% | 68% | 71% | 74% |
| 63 Tf | 63% | 68% | 71% | 74% | 77% |
| 65 Tf | 67% | 71% | 75% | 78% | 80% |

The table may thus indicate the required flow for maintaining a specific temperature within a rack. For example, when supplying cool air to the connecting plenum at the temperature of 59 F and the rack temperature rise by 25 F, a flow of 61% of the total flow rate of the rack may be necessary to maintain 75 F in the rack.

Although the present disclosure has been described in detail, it should be understood that various changes, substitutions, and alterations can be made hereto without departing from the spirit and the scope of the disclosure as defined by the appended claims.

What is claimed is:

1. A system for controlling the temperature of a rack, comprising:
    a connecting plenum configured to receive incoming cooling air from outside the rack for cooling the rack;
    a front plenum coupled to the connecting plenum and configured to receive the incoming cooling air from the connecting plenum and deliver the incoming cooling air to the rack, the incoming cooling air being warmed by powered electrical components disposed in the rack as it passes through the rack;
    at least one ventilator for recycling the warmed cooling air from a rack back side to the connecting plenum to be mixed with the incoming cooling air;
    at least one temperature sensor for sensing air temperature in the system; and
    a controller for controlling the at least one ventilator based at least on the sensed air temperature.

2. A system according to claim 1, further comprising a back plenum configured to transport at least a portion of the warmed cooling air exiting the rack back side toward the connecting plenum.

3. A system according to claim 2, further comprising a guide element for guiding the warmed cooling air from the back plenum to the connecting plenum, the guide element being configured for separating, in the vicinity of a particular temperature sensor, the warmed cooling air from the back plenum from the incoming cooling air entering the connecting plenum from outside the rack.

4. A system according to claim 2, wherein the at least one ventilator includes a fan configured to move the warmed cooling air from the back plenum to the connecting plenum.

5. A system according to claim 2, wherein the at least one ventilator includes an actuated vent for controlling the flow of the warmed cooling air from the back plenum to the connecting plenum.

6. A system according to claim 1, further comprising a solid front door comprising a front access panel configured to allow at least partial access to the rack.

7. A system according to claim 1, wherein the at least one temperature sensor includes a temperature sensor associated with at least one powered electrical component disposed in the rack.

8. A system according to claim 1, wherein the connecting plenum is a lower plenum connectable to a floor plenum such that the connecting plenum can receive the incoming cooling air from the floor plenum.

9. A system according to claim 1, wherein the connecting plenum is an upper plenum connectable to a ceiling plenum such that the connecting plenum can receive the incoming cooling air from the ceiling plenum.

10. A system according to claim 1, wherein the connecting plenum is configured to receive the incoming cooling air from an air-conditioned room in which the system is located.

11. A system according to claim 1, wherein the at least one temperature sensor comprises a first temperature sensor located for sensing the temperature of the incoming cooling air and a second temperature sensor located for sensing the warmed cooling air moved by the at least one ventilator.

12. A system, comprising:
    a rack;
    a plurality of information handling systems disposed in the rack; and
    a temperature control system for controlling the temperature of the rack, comprising:
        a connecting plenum configured to receive incoming cooling air from outside the rack for cooling the rack;
        a front plenum coupled to the connecting plenum and configured to receive the incoming cooling air from the connecting plenum and deliver the incoming cooling air to the rack, the incoming cooling air being warmed by the information handling systems as it passes through the rack;
        a back plenum configured to received the warmed cooling air from the rack;
        at least one controllable ventilator for recycling the warmed cooling air from the back plenum to the connecting plenum to be mixed with the incoming cooling air;
        at least one temperature sensor for sensing air temperature in the system; and
        a controller for controlling the at least one ventilator based at least on the sensed air temperature.

13. A system according to claim 12, further comprising a guide element for guiding the warmed cooling air from the back plenum to the connecting plenum, the guide element being configured for separating, in the vicinity of a particular temperature sensor, the warmed cooling air from the back plenum from the incoming cooling air entering the connecting plenum from outside the rack.

14. A system according to claim 12, wherein the at least one controllable ventilator includes a fan configured to move the warmed cooling air from the back plenum to the connecting plenum.

15. A system according to claim 12, wherein the at least one controllable ventilator includes an actuated vent for controlling the flow of the warmed cooling air from the back plenum to the connecting plenum.

16. A system according to claim 12, wherein the connecting plenum is a lower plenum connectable to a floor plenum such that the connecting plenum can receive the incoming cooling air from the floor plenum.

17. A system according to claim 12, wherein the connecting plenum is an upper plenum connectable to a ceiling plenum such that the connecting plenum can receive the incoming cooling air from the ceiling plenum.

18. A method for controlling a cooling system configured to control the temperature of an information handling system rack, the method comprising:
    setting a target temperature or a target temperature band for an information handling system rack;
    operating a cooling system such that incoming cooling air is received from outside the cooling system into a connection plenum, flows from the connection plenum to a delivery plenum, and flows from the delivery plenum through the information handling system rack, the incoming cooling air being warmed by electrical components disposed in the information handling rack as the incoming cooling air flows through the information handling system rack;

taking one or more air temperature measurements; and based on the one or more air temperature measurements, controlling one or more ventilators to control an amount of the warmed cooling air from the information handling system rack to recycle back into the connection plenum to mix with the incoming cooling air.

19. A method according to claim 18, wherein controlling one or more ventilators comprises controlling a speed of one or more fans.

20. A method according to claim 18, wherein controlling one or more ventilators comprises opening or closing one or more vents.

* * * * *